(12) United States Patent
Kronholz et al.

(10) Patent No.: US 8,673,710 B2
(45) Date of Patent: *Mar. 18, 2014

(54) FORMATION OF A CHANNEL SEMICONDUCTOR ALLOY BY A NITRIDE HARD MASK LAYER AND AN OXIDE MASK

(75) Inventors: Stephan Kronholz, Dresden (DE); Rohit Pal, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 175 days.

This patent is subject to a terminal disclaimer.

(21) Appl. No.: 13/197,387

(22) Filed: Aug. 3, 2011

(65) Prior Publication Data
US 2012/0156864 A1    Jun. 21, 2012

(30) Foreign Application Priority Data

Dec. 21, 2010  (DE) .......................... 10 2010 063 774

(51) Int. Cl.
*H01L 21/8238* (2006.01)

(52) U.S. Cl.
USPC .......................................... 438/199; 438/207

(58) Field of Classification Search
CPC .................... H01L 21/8238; H01L 21/823878
USPC .......... 438/197, 199, 207, 791; 257/E21.051, 257/E21.058, E21.206, E21.632, E21.409
See application file for complete search history.

(56) References Cited

U.S. PATENT DOCUMENTS

| | | | | |
|---|---|---|---|---|
| 2005/0112817 A1* | 5/2005 | Cheng et al. | ................. | 438/219 |
| 2007/0090467 A1* | 4/2007 | Zhu | ................. | 257/390 |
| 2010/0213553 A1* | 8/2010 | Hargrove et al. | ............. | 257/410 |
| 2010/0289094 A1 | 11/2010 | Reichel et al. | ................. | 257/409 |

FOREIGN PATENT DOCUMENTS

DE   102009021489 A1   11/2010   .......... H01L 21/8234

OTHER PUBLICATIONS

Translation of Official Communication from German Patent Office for German Patent Application No. 10 2010 063 774.2 dated Jul. 6, 2011.

* cited by examiner

*Primary Examiner* — Khiem D Nguyen
(74) *Attorney, Agent, or Firm* — Amerson Law Firm, PLLC

(57) ABSTRACT

When forming sophisticated high-k metal gate electrode structures, the uniformity of the device characteristics may be enhanced by growing a threshold adjusting semiconductor alloy on the basis of a hard mask regime, which may result in a less pronounced surface topography, in particular in densely packed device areas. To this end, in some illustrative embodiments, a deposited hard mask material may be used for selectively providing an oxide mask of reduced thickness and superior uniformity.

22 Claims, 7 Drawing Sheets

* # FORMATION OF A CHANNEL SEMICONDUCTOR ALLOY BY A NITRIDE HARD MASK LAYER AND AN OXIDE MASK

BACKGROUND OF THE INVENTION

1. Field of the Invention

Generally, the present disclosure relates to integrated circuits including sophisticated transistor elements that comprise advanced gate structures including a metal-containing electrode and a high-k gate dielectric of increased permittivity.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a material for a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architectures based on high-k dielectrics, additionally, transistor performance may also be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance, even at a less critical thickness, compared to a silicon dioxide layer, while additionally maintaining leakage currents at an acceptable level. On the other hand, a metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has been proposed to appropriately adjust the threshold voltage of transistor devices by providing a specifically designed semiconductor material at the interface between the gate dielectric material and the channel region of the transistor device, in order to appropriately select the band gap of the specifically designed semiconductor material to the work function of the metal-containing gate electrode material, thereby obtaining the desired threshold voltage of the transistor under consideration. Typically, a corresponding specifically designed semiconductor material, such as silicon/germanium and the like, may be provided by an epitaxial growth technique at an early manufacturing stage, which may also represent an additional complex process step, which, however, may avoid complex processes in an advanced stage for adjusting the work function and thus the threshold voltages in a very advanced process stage.

It turns out, however, that the manufacturing sequence of forming the threshold adjusting semiconductor alloy may have a significant influence on transistor characteristics, as will be described in more detail with reference to FIGS. 1a-1f.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Furthermore, an isolation structure 102C is formed in the semiconductor layer 102, thereby laterally delineating and thus defining active regions 102A, 102B. In this context, an active region is to be understood as a semiconductor material in which an appropriate dopant profile is formed or is to be created in order to form PN junctions for one or more transistor elements. In the example shown in FIG. 1a, the active region 102A corresponds to a P-channel transistor while the active region 102B represents an N-channel transistor. That is, the active regions 102A, 102B comprise an appropriate basic dopant concentration in order to determine the conductivity of a P-channel transistor and an N-channel transistor, respectively. It should be appreciated that the active regions 102A, 102B may comprise or may receive other components, such as germanium, carbon and the like, in order to appropriately adjust the overall electronic characteristics. Similarly, in the active region 102A, an appropriate valence band offset is to be adjusted with respect to a sophisticated gate electrode structure still to be formed by forming an appropriate semiconductor alloy, as will be described later on.

The semiconductor device 100 as illustrated in FIG. 1a may be formed on the basis of the following conventional process strategies. The isolation structure 102C is formed by well-established lithography, etch, deposition, planarization and anneal techniques, in which appropriate hard mask layers, such as a pad oxide and a silicon nitride material, are formed on the semiconductor layer 102, followed by the patterning of a trench in the semiconductor layer 102. Thereafter, the trench is filled with an appropriate insulating material, such as silicon dioxide and the like. It should be appreciated that the process sequence for forming the isolation structure 102C may result in a more or less pronounced stress level in the active regions 102A, 102B. After the removal of any excess material and planarizing the surface topography, the further processing is typically continued by performing a plurality of implantation processes using an appropriate masking regime in order to introduce the required dopant species for generating the basic dopant concentration in the active regions 102A, 102B, as required in view of the transistors to be formed therein and thereabove. After activating the dopant species and re-crystallizing implantation-induced damage, the further processing is continued by removing any material residues, such as oxide materials, and exposing the device 100 to an oxidizing ambient 110, which is typically established on the basis of elevated temperatures, for instance in the range of 700-1200° C. Consequently, during the dry oxidation process 110, a mask layer 104 is formed in a well-controllable manner during the process 110. For example, a maximal thickness of the mask layer 104 is adjusted to 10 nm or less.

FIG. 1b schematically illustrates the semiconductor device 100 in a further advanced manufacturing stage, in which an etch mask 105 in the form of a resist material is formed above the semiconductor device 100 such that the active region 102B and a part of the isolation structure 102C, i.e., the mask material 104, are covered by the mask 105, while the active region 102A, i.e., the mask material 104 formed thereon, and the remaining part of the isolation structure 102C, are exposed to a wet chemical etch ambient 111 in order to selectively remove the mask material 104 from the active region 102A. During the etch process 111, which is typically performed on the basis of diluted hydrofluoric acid (HF), the resist material 105 has to withstand the etch attack, wherein, in particular, the edge 105E of the mask 105 positioned above the isolation structure 102C may be increasingly eroded during the etch process 111. For example, an etch time of several minutes may be required in order to reliably remove the mask material 104 from the active region 102A. Due to the increasing erosion of the edge region 105E, the boundary between the mask area and the non-mask area in the isolation region 102C may not be well defined and may thus result in a certain degree of "roughness" due to the varying degree of material erosion, which may affect the further processing of the device 100, in particular when the active regions 102A, 102B represent closely-spaced active regions, which are thus laterally delineated by the isolation region 102C including the eroded surface area.

FIG. 1c schematically illustrates the semiconductor device 100 in a further advanced manufacturing stage, i.e., after the selective removal of the mask material 104 from above the active region 102A and after the removal of the etch mask 105 (FIG. 1b). As discussed above, due to the preceding etch sequence based on hydrofluoric acid, a certain material loss may occur in the isolation structure 102C, wherein the increasing mask erosion during the etch process may result in a non-well-defined transition area in the isolation region 102C.

FIG. 1d schematically illustrates the semiconductor device 100 when exposed to a further reactive process ambient 106, which may include a cleaning process and the like in order to prepare the device 100 for the subsequent deposition of a silicon/germanium alloy selectively on the first active region 102A. The process 106 may be established on the basis of any appropriate chemistry in order to remove contaminants and the like which may have been produced during the previous removal of the etch mask and the like. Typically, the cleaning process 106 may cause a certain degree of material erosion of the mask 104, thereby reducing its thickness, as indicated by 104R, however, without exposing the surface portions of the second active region 102B.

FIG. 1e schematically illustrates the semiconductor device 100 during a selective epitaxial growth process 107, in which process parameters, such as temperature, pressure, flow rates of precursor gases and the like, are appropriately selected such that a material deposition is substantially restricted to exposed silicon surface areas, while the silicon dioxide-based surface areas substantially prevent a deposition of material. That is, the deposition process 107 may be adjusted such that a certain degree of deposition selectivity is obtained with respect to silicon material in the active region 102A and any oxide surface areas, such as the deposition mask 104 and the isolation region 102C. As previously explained, the finally-obtained threshold voltage of a transistor to be formed in and above the active region 102A strongly depends on the characteristics of the silicon/germanium material 108, such as the germanium concentration thereof and the thickness, such that precisely determined process conditions have to be established during the process 107. After the deposition of silicon/germanium alloy 108, which is now a part of the active region 102A having the appropriate band gap for forming thereon sophisticated gate electrode structures, the deposition mask 104 is removed, for instance by using hydrofluoric acid, which in turn may also result in a certain material removal in the isolation region 102C, thereby contributing to a further pronounced surface topography between the active regions 102A, 102B and the isolation region 102C, which may additionally have a pronounced surface topography due to the previously-performed etch process 111 as described with reference to FIG. 1b.

FIG. 1f schematically illustrates the semiconductor device 100 in a further advanced manufacturing stage, in which a transistor 150A is formed in and above the active region 102A, which now includes at least a portion of the silicon/germanium alloy 108. Similarly, a transistor 150B is formed in and above the active region 102B. Moreover, the transistors 150A, 150B, for instance representing a P-channel transistor and an N-channel transistor, respectively, comprise gate electrode structures 160A, 160B, respectively. As shown, the gate electrode structure 160A is formed on the threshold adjusting silicon/germanium alloy 108 and comprises a gate dielectric material 161, which includes a high-k dielectric material, wherein the gate dielectric material 161 is covered by a metal-containing electrode material 162. Moreover, a conventional electrode material 163, such as amorphous silicon, polycrystalline silicon and the like, is typically formed above the electrode material 162. Moreover, the sensitive materials 161 and 162 are laterally confined by an appropriate spacer or liner material 165, for instance, provided in the form of a silicon nitride material and the like. Furthermore, a sidewall spacer structure 164, which may comprise one or more spacer elements, possibly in combination with any etch stop liners, is provided according to the process and device requirements. The gate electrode structure 160B has a similar configuration, wherein, however, the gate dielectric material 161 is directly formed on the active region 102B. It should be appreciated that the gate electrode structures 160A, 160B may further differ from each other with respect to the resulting work function of the material layers 162. That is, the transistor 150A may require a different work function so as to obtain, in combination with the silicon/germanium material 108, the desired threshold voltage for a P-channel transistor. To this end, any appropriate work function metal species, such as aluminum, may be incorporated into the layer 162 and/or the gate dielectric layer 161. Similarly, an appropriate work function metal species, such as lanthanum and the like, may be incorporated into the layer 162 and/or the layer 161 of the transistor 150B in order to obtain the desired threshold voltage.

The semiconductor device 100 as shown in FIG. 1f may be formed on the basis of any well-established process techniques, which include the deposition of the materials 161, 162 and 163, possibly in combination with other materials, such as dielectric cap layers, anti-reflective coating (ARC) materials and the like. As discussed above, appropriate patterning regimes and materials may be used for the layers 161 and 162 so as to obtain a desired high capacitive coupling in combination with a superior conductivity, while also a desired work function and thus threshold voltage for the transistors 150A, 150B, wherein the silicon/germanium alloy 108 provides the desired end gap offset. After the patterning of the sophisticated layer stack, at least the sensitive materials 161 and 162 have to be reliably confined in order to not unduly expose these materials to any reactive process atmospheres, which may otherwise result in significant modifications of these materials, which in turn may lead to a significant drift of the resulting threshold voltage. To this end, sophisticated deposition techniques may be applied in order to form the liner 165, followed by appropriate deposition and etch processes for forming a part of the sidewall spacer structure 164, which may then be used to introduce dopant species for forming drain and source regions 153 in the active regions 102A, 102B, respectively. To this end, well-established implantation strategies and masking regimes may be applied. Thereafter, an anneal process may be applied, thereby adjusting the final lateral and vertical profile of the drain and source regions 153, thereby also adjusting the final length of a channel region 152 positioned below the respective gate electrode structures 160A, 160B.

It should be appreciated that, although the above-described process strategy may enable forming sophisticated gate electrode structures and thus transistors, a significant variability of the transistor characteristics therein may, however, be observed. For example, the characteristics of the silicon/germanium alloy 108 may vary in a length direction, i.e., in FIG. 1f the horizontal direction, which may, however, not negatively affect the resulting transistor characteristics. On the other hand, a significant variation of the material characteristics is observed in the transistor width direction, i.e., in a direction perpendicular to the drawing plane of FIG. 1f, wherein basically the same edge effects may be observed, which may, for instance, be caused by a pronounced surface topography between the isolation region 102C and the active region 102A, while other negative influences may be caused by the previously-used deposition mask 104 (FIGS. 1a and 1b) since the formation thereof and the selective removal may result in different conditions in the center of the active region 102A compared to the edge thereof. Furthermore, the irregular surface topography of the isolation region 102C, in particular between closely-spaced transistor devices, may also affect the process of forming the protective liner or spacer 165, which in turn may result in a deterioration of the sensitive materials 161 and 162 in one or both of the transistors 150A, 150B, which, thus, may also contribute to significant yield losses.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which a threshold adjusting semiconductor material may be provided selectively in one type of transistor by using an improved hard mask regime, which may reduce the resulting surface topography, which has been identified as a major source for device and process non-uniformities in forming sophisticated gate electrode structures. To this end, the patterning sequence for providing a hard mask for the selective epitaxial growth process may be based on a deposited hard mask material, in one illustrative embodiment a silicon nitride material, which may generally enable reducing the exposure of the complex semiconductor device to reactive process atmospheres in which a significant degree of material erosion may occur in the isolation structures since the difference in surface topography between the active semiconductor regions and the isolation regions laterally positioned adjacent to the active semiconductor regions, in particular in densely packed device areas, such as memory areas including a high density of memory cells, may result in irregularities upon forming complex high-k metal gate electrode structures in an early manufacturing stage. In some illustrative embodiments disclosed herein, although using a deposited hard mask material at a certain phase of the patterning process, nevertheless well-established hard mask materials, such as silicon dioxide, may be used for the actual selective deposition process, however, with superior thickness control in order to reduce the usage of silicon dioxide etching chemicals, such as hydrofluoric acid and the like. In this manner, well-established selective epitaxial growth recipes may still be applicable, while on the other hand superior topography conditions may be achieved.

One illustrative method disclosed herein comprises forming a first hard mask layer above a first active region and a second active region of a semiconductor device. Moreover, the method comprises removing the first hard mask layer selectively from above the second active region. Furthermore, a second hard mask layer is formed selectively above the second active region and the first hard mask layer is selectively removed from above the first active region. The method further comprises forming a layer of a semiconductor alloy on the first active region and using the second hard mask layer formed above the second active region as a growth mask. Additionally, the method comprises removing the second hard mask layer and forming a first gate electrode structure of a first transistor on the layer of a semiconductor alloy and forming a second gate electrode structure of a second transistor on the second active region. The first and second gate electrode structures comprise a metal-containing electrode material and a gate insulation layer that includes a high-k dielectric material. A further illustrative method disclosed herein relates to forming a semiconductor device. The method comprises forming a first hard mask layer above a first active region and a second active region. Moreover, the first hard mask layer is selectively removed from the second active region. The method further comprises performing an oxidation process in the presence of the first hard mask layer formed above the first active region so as to form a second hard mask layer selectively above the second active region. Additionally, the first hard mask layer is removed from above the first active region in the presence of the second hard mask layer. The method further comprises forming a layer of a semiconductor alloy in the first active region by using the second hard mask layer as a growth mask. Additionally, the method comprises forming a first gate electrode structure of a first transistor on the first active region that includes the layer of a semiconductor alloy and forming a second gate electrode structure of a second transistor on the second active region.

A further illustrative method disclosed herein comprises depositing a silicon and nitrogen-containing hard mask layer above a first active region and a second active region of a semiconductor device. The method further comprises forming an etch mask above the second active region so as to cover a portion of the first hard mask layer above the second active region. Moreover, the method comprises removing the mask layer selectively from above the first active region and forming a layer of a semiconductor alloy on the first active region and using the mask layer above the second active region as a growth mask. The method further comprises performing an etch process so as to remove the hard mask layer from above the second active region. Furthermore, a first gate electrode structure is formed on the first active region and a second gate electrode structure is formed on the second active region.

BRIEF DESCRIPTION OF THE DRAWINGS

The disclosure may be understood by reference to the following description taken in conjunction with the accompanying drawings, in which like reference numerals identify like elements, and in which.

Figure 1A:
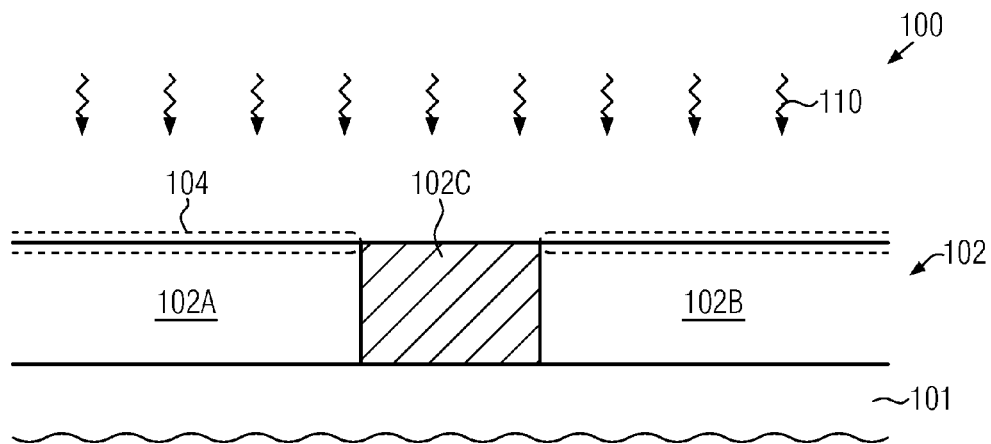
FIGS. 1a-1f schematically illustrate cross-sectional views of a semiconductor device during various manufacturing stages in forming a threshold adjusting silicon/germanium layer selectively on the active region of one transistor type and patterning sophisticated high-k metal gate electrode structures, according to conventional process strategies.
Figure 1B:
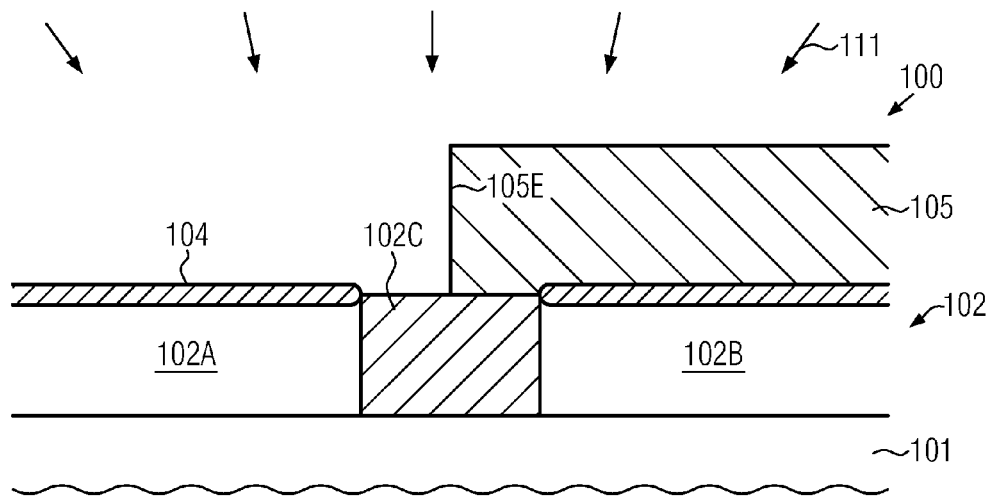
Figure 1C:
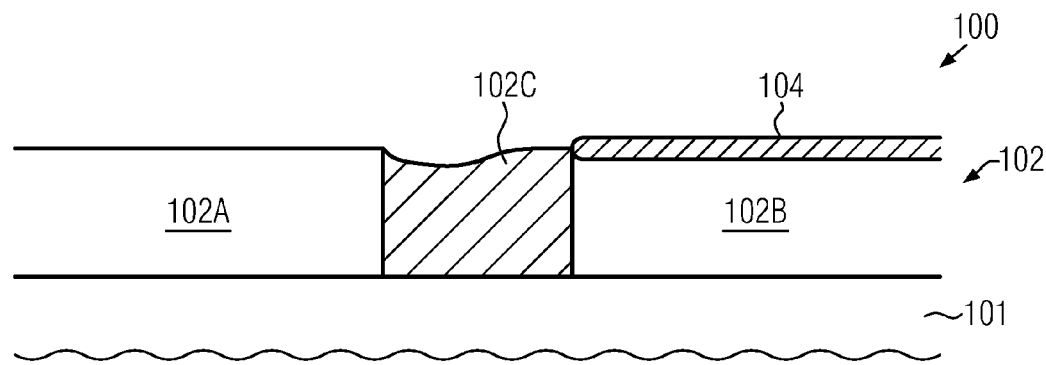
Figure 1D:
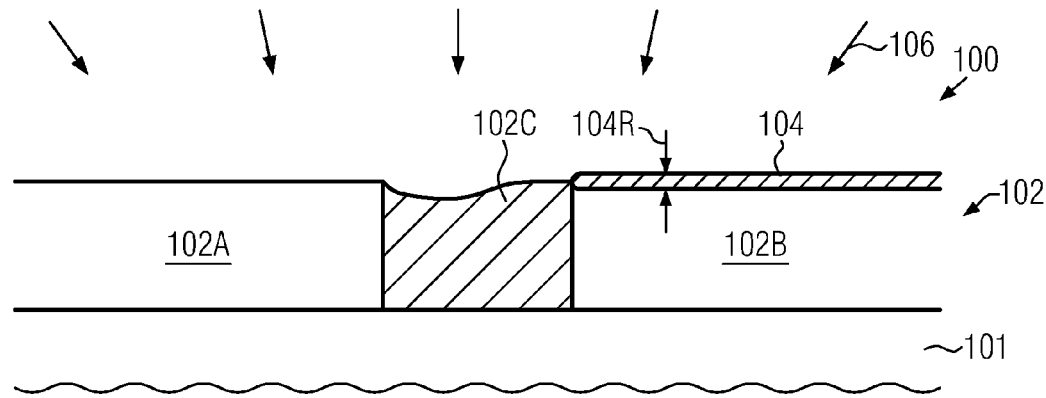
Figure 1E:
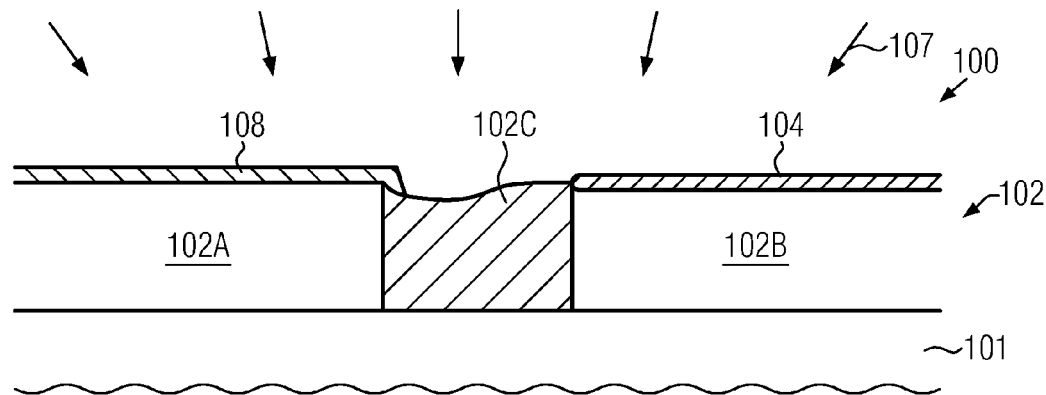
Figure 1F:
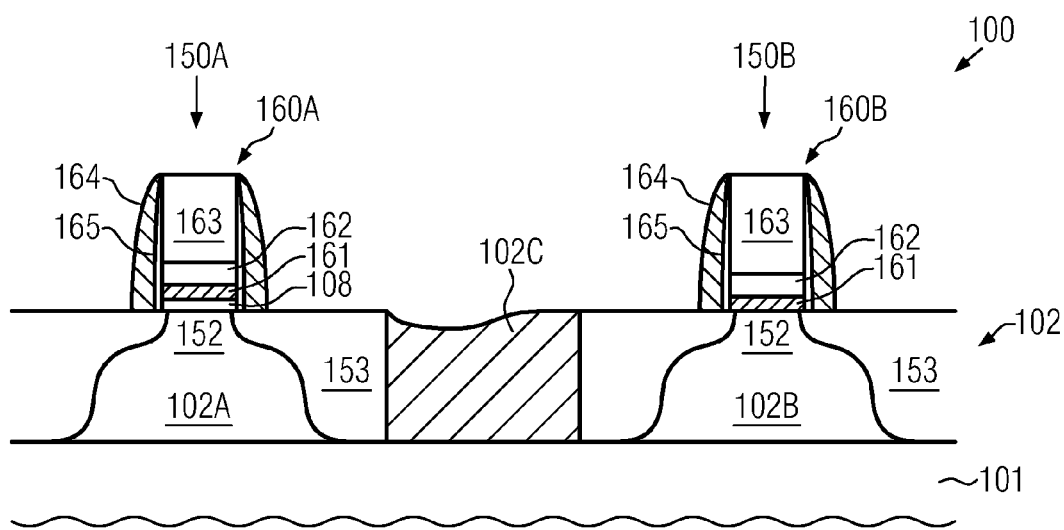

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques in which the threshold adjusting semiconductor material, such as a silicon/germanium material and the like, may be selectively formed on an active region of corresponding transistors by using a hard mask regime, which may provide superior surface topography prior to and during the patterning of sophisticated high-k metal gate electrode structures. To this end, in some illustrative embodiments, generally, a deposited silicon nitride-based hard mask material may be used as a deposition mask during the selective epitaxial growth process. Since the patterning and the removal of the growth mask may be based on a chemistry that may not unduly result in material erosion of the isolation regions, generally a superior surface topography may be obtained.

In other illustrative embodiments disclosed herein, the exposure of the sensitive device surface areas to oxide-consuming chemicals may be significantly reduced, while at the same time similar process conditions during the selective epitaxial growth process may be maintained compared to conventional and well-established deposition recipes. To this end, a hard mask material may be deposited so as to act as an oxidation masking an oxidation process in which selectively an oxide may be grown on one type of active regions, while the oxidation mask may then be removed on the basis of efficient etch techniques, such as a plasma assisted etch process, or in other illustrative embodiments on the basis of a wet chemical etch process with a significantly reduced degree of material erosion in the isolation region. Consequently, the actual selective epitaxial growth process may be performed on the basis of an oxide growth mask, thereby enabling applying well-established deposition recipes. In some illustrative embodiments, the oxidation process may be based on a remaining oxide layer of a thickness of approximately 4 nm and less, which may have been formed in an earlier manufacturing stage so as to act as a "pad oxide" in order to form isolation regions and incorporate well dopant species into the active region. Consequently, a very uniform base oxide material may be provided as a start condition for the subsequent selective oxidation process, which may thus result in a certain and well-defined increase of the previously formed oxide material, thereby enabling a very well-controllable increase of the oxide mask material, which in turn may result in a reduced degree of exposure to any oxide-consuming chemicals in a later phase, i.e., after the selective growth of the threshold adjusting semiconductor material and the removal of the oxide mask material.

Consequently, the further processing, i.e., the patterning of the sophisticated high-k metal gate electrode structures may be accomplished on the basis of a less pronounced surface topography. In particular in densely packed device areas, such as memory areas including a dense array of memory cells, it turns out that, for a critical gate length of 30 nm and less, the patterning process for forming the gate electrode structures may conventionally result in significant yield loss, which is assumed to be strongly influence by the surface topography caused during the preceding process sequence for providing the threshold adjusting semiconductor alloy. For example, during the sophisticated gate patterning process, various metal layers have to be provided and patterned in order to individually adjust the work function of the gate materials for the P-channel transistors and N-channel transistors, possibly for various sub-types of P-channel transistors and N-channel transistors, which may result in a significant variability of the resulting transistor characteristics, such as gate leakage currents and the like, thereby possibly causing a total failure of the resulting memory cells.

With reference to FIGS. 2a-2k, further illustrative embodiments will now be described in more detail, wherein reference may also be made to FIGS. 1a-1f, if required.

Figure 2A:
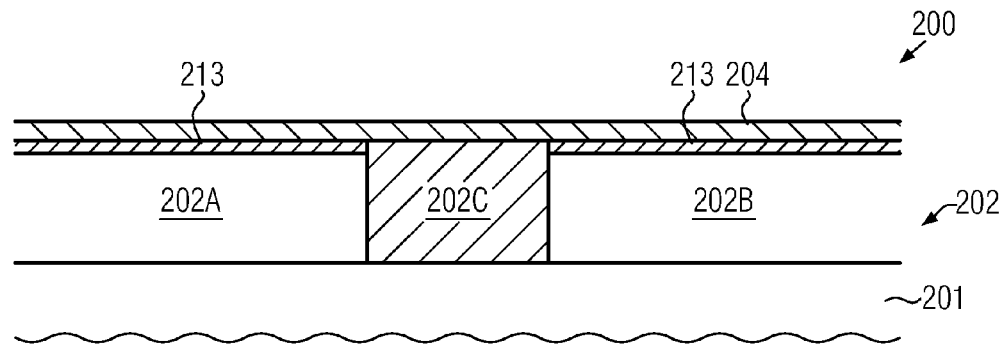
FIGS. 2a-2g schematically illustrate cross-sectional views of a semiconductor device during various manufacturing stages in forming a threshold adjusting semiconductor alloy selectively on an active region on the basis of a hard mask regime including an oxidation-hindering mask layer so as to selectively provide an oxide-based hard mask on one type of active region, according to illustrative embodiments.

FIG. 2a schematically illustrates a cross-sectional view of a semiconductor device 200 comprising a substrate 201 and a semiconductor layer 202. In some illustrative embodiments, the semiconductor layer 202 and the substrate 201 may form a bulk configuration, in which the semiconductor layer 202 may directly connect to a crystalline material of the substrate 201. In other cases, an SOI configuration (not shown) may be provided when a buried insulating material may be positioned below the semiconductor layer 202. Furthermore, the semiconductor layer 202 may comprise a plurality of semiconductor regions or active regions 202A, 202B, which are laterally delineated by an isolation region 202C. As explained above, in some cases, the active regions 202A, 202B may represent closely spaced active regions of transistors of different conductivity type, which are electrically isolated from each other in the lateral direction by the isolation structure 202C, so that the general surface conditions of the active regions 202A, 202B and of the isolation region 202C may have a strong influence on the resulting device characteristics. Basically for the components described so far, the same criteria may apply as previously explained with reference to the semiconductor device 100. Moreover, in some illustrative embodiments, a pad oxide layer 213 may be formed on the active regions 202A, 202B and may represent the remaining oxide layer, which may have initially been provided as a pad oxide layer upon forming the isolation structure 202C and the active regions 202A, 202B. It should be appreciated that the layer 213 may initially be provided with a high degree of uniformity with a well-defined thickness of approximately 5 nm and less, wherein the thickness may have been reduced during the previous processing, for instance due to any etch processes, resist strip processes and the like. For example, the layer 213 as shown in FIG. 2a may have a thickness of approximately 3-5 nm. Furthermore, in the manufacturing stage shown, a hard mask layer 204 is formed above the active regions 202A, 202B and the isolation structure 202C, wherein, in some illustrative embodiments, the hard mask layer 204 may be provided in the form of a silicon and nitrogen-containing material, which may also be referred to as a silicon nitride material, irrespective of the precise stoichiometric composition of the material of the layer 204. In some illustrative embodiments, the layer 204 may be provided with a thickness of approximately 10 nm and less, such as approximately 8 nm and less. It should be understood that the term approximately is to include any variations caused by process non-uniformities and measurement non-uniformities, so that typically a variation of 10 percent and less is included in the term approximately.

The semiconductor device 200 as shown in FIG. 2a may be formed on the basis of any appropriate process strategy. For example, the components 202A, 202B, 202C may be formed on the basis of manufacturing techniques as are also discussed above with reference to the device 100. Moreover, in the embodiment shown, the pad oxide layer 213 may be preserved, while in other cases the layer 213 may be removed on the basis of any appropriate etch chemistries, such as HF, wherein also a certain portion of the isolation region 202C may be removed so that, in total, a moderately planar surface topography may be preserved. In this case, the layer 204 may be directly deposited on the active region 202A, 202B. The deposition of the material 204 may be accomplished by any well-established deposition recipes, such as thermally activated chemical vapor deposition (CVD), plasma assisted CVD and the like. It should be appreciated that a plurality of deposition recipes are well established for forming a silicon nitride material.

Figure 2B:
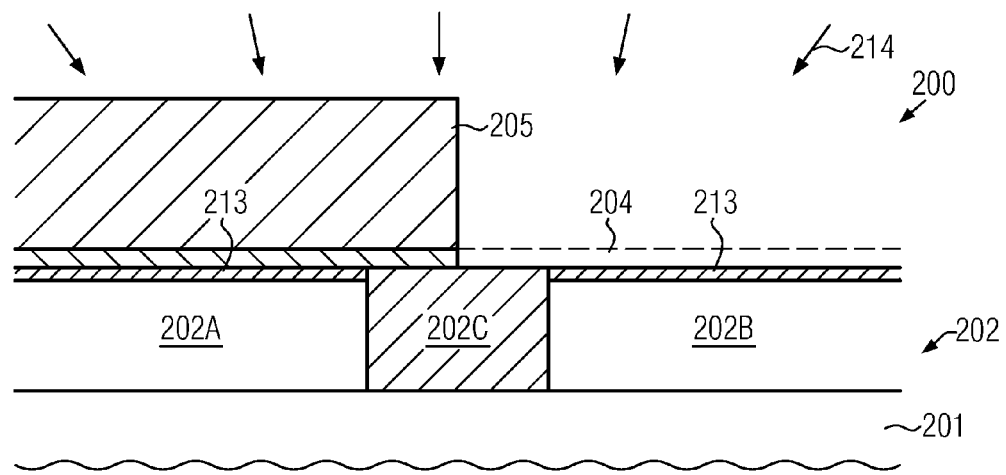

FIG. 2b schematically illustrates the semiconductor device 200 in a further advanced manufacturing stage. As shown, an etch mask 205, such as a resist mask, is formed so as to cover the active region 202A and a portion of the isolation region 202C. To this end, an appropriate lithography mask in combination with well-established lithography techniques may be applied. Furthermore, the device 200 is exposed to an etch ambient of a process 214 in order to remove the hard mask material 204 selectively with respect to the active region 202B and, in some illustrative embodiments, as shown in FIG. 2b, selectively with respect to the preserved oxide layer 213. To this end, the etch process 214 may be performed as a highly selective etch process for removing, for instance, silicon nitride material selectively with respect to silicon dioxide and silicon material. For example, well-established plasma-based etch recipes may be applied, while in other cases wet chemical etch chemistries may be used, such as SPM/APM (sulfuric acid/hydrogen peroxide mixture; ammonium hydroxide/hydrogen peroxide mixture). In this manner, the exposed portion of the layer 204 may be removed without unduly affecting the exposed portion of the isolation region 202C and without unduly affecting the active region 202B. Furthermore, in embodiments in which the oxide layer 213 is still in place, this layer may act as an efficient etch stop material. Thereafter, the etch mask 205 may be removed on the basis of any appropriate removal process, such as a resist strip process and the like.

Figure 2C:
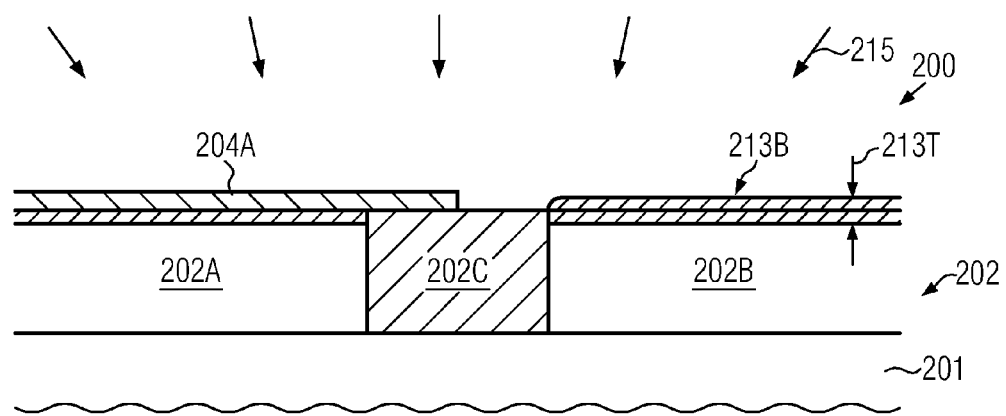

FIG. 2c schematically illustrates the semiconductor device 200 in a further advanced manufacturing stage in which a surface treatment 215 is performed selectively in or above the active region 202B, while the remaining portion of the layer 204 (FIG. 2b), now indicated as layer 204A, may act as an efficient mask material. In some illustrative embodiments, the surface treatment 215 may be performed as an oxidation process in order to form a hard mask layer 213B selectively on or above the active region 202B. In some illustrative embodiments, as discussed above, the oxidation process 215 may result in an increase of a thickness 213T of the previously provided layer 213, wherein, as discussed above, superior process uniformity may be achieved, thereby also contributing to superior uniformity of material composition and thickness of the mask layer 213B. For example, for an initial thickness of the layer 213 (FIG. 2b) of 3-4 nm, the oxidation process 215 may provide another 2-4 nm, thereby achieving a thickness of the oxide-based mask layer 213B that is sufficient to withstand any subsequent cleaning processes performed prior to performing a selective epitaxial growth process, while at the same time the thickness is reduced compared to conventional strategies, thereby reducing the amount of oxygen-consuming chemistry that is to be applied upon removing the mask 213B in a later manufacturing stage. Furthermore, by providing the hard mask 213B in the form of an oxide material may enable applying well-established selective deposition recipes, which may have been developed with a high degree of selectivity between silicon dioxide and silicon upon depositing a desired threshold adjusting semiconductor alloy. The oxidation process 215 may be formed on the basis of any appropriate process conditions, for instance in the form of a dry oxidation process based on elevated temperatures and the like. Also in these sophisticated process conditions, the hard mask layer 204A may act as an efficient oxidation mask.

Figure 2D:
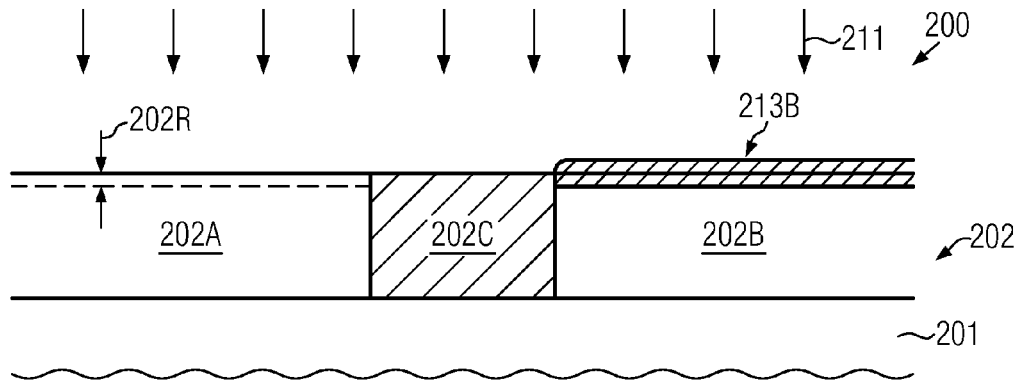

FIG. 2d schematically illustrates the device 200 in a further advanced manufacturing stage. As shown, a removal process 211 may be performed so as to remove the hard mask layer 204A (FIG. 2c) from above the active region 202A. In some illustrative embodiments, the etch process 211 may be performed on the basis of a plasma-based etch ambient, which is to be understood as a gaseous ambient including reactive ions, which may be accelerated in a more or less pronounced degree towards the surface of the device 200. For example, reactive ion etching is to be understood as a plasma-based etch process. The etch process 211 may be performed with a high degree of selectivity with respect to the hard mask layer 213B, wherein a certain degree of material erosion may be taken into consideration into the overall material erosion budget when performing the oxidation process 215 of FIG. 2c. Furthermore, in the embodiment shown, the process 211 may result in a certain degree of recessing, as indicated by 202R, which may result in a superior surface topography after filling the recess 202R with the threshold adjusting semiconductor material. In this case, the process 211 may be designed so as to result in removal of any pad oxide material which, however, may also consume a similar amount of material in the isolation structure 202C and the mask 213B, thereby not unduly influencing the resulting surface topography. On the other hand, the removal of the exposed silicon material in the active region 202A may be somewhat greater compared to the removal of an oxide material, which may thus result in the recess 202R. In other illustrative embodiments the etch chemistry in the process 211 may be appropriately adapted so as to preferably remove silicon material with respect to silicon dioxide in order to form the recess 202R in a highly controllable and desired manner.

In other cases, the removal of the hard mask above the active region 202A may be accomplished on the basis of a wet chemical etch process, as will be described later on in more detail.

Figure 2E:
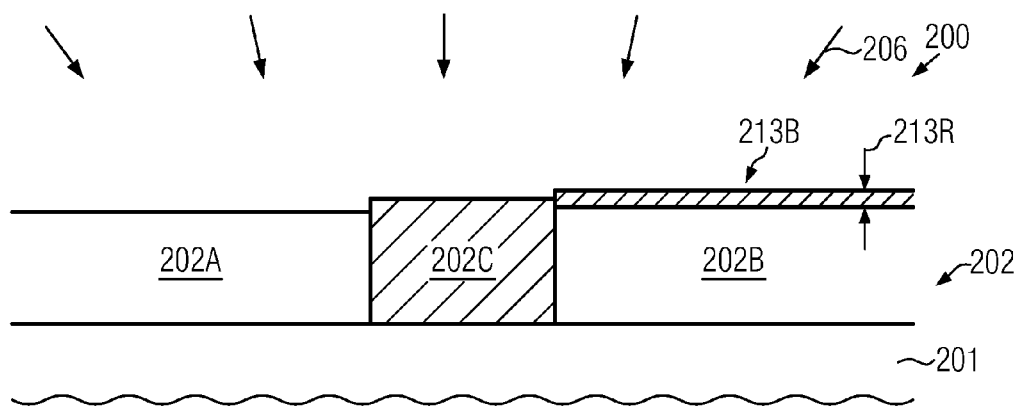

FIG. 2e schematically illustrates the semiconductor device 200 when exposed to a cleaning process 206, in which the surface of the active region 202A may be prepared for a subsequent epitaxial growth process. As discussed above with reference to the semiconductor device 100, frequently, an oxide consuming etch chemistry may be applied, wherein, in this case, the thickness of the hard mask layer 213B may be reduced, as indicated by 213R, thereby, however, still preserving a sufficient material layer for acting as a deposition mask during the subsequent processing. A corresponding material erosion may also occur in the isolation region 202C, which, however, may not unduly affect the overall surface topography, for instance when the recess 202R (FIG. 2d) is provided in the active region 202A. In this case, a certain degree of leveling may occur between the active region 202A and the isolation region 202C.

Figure 2F:
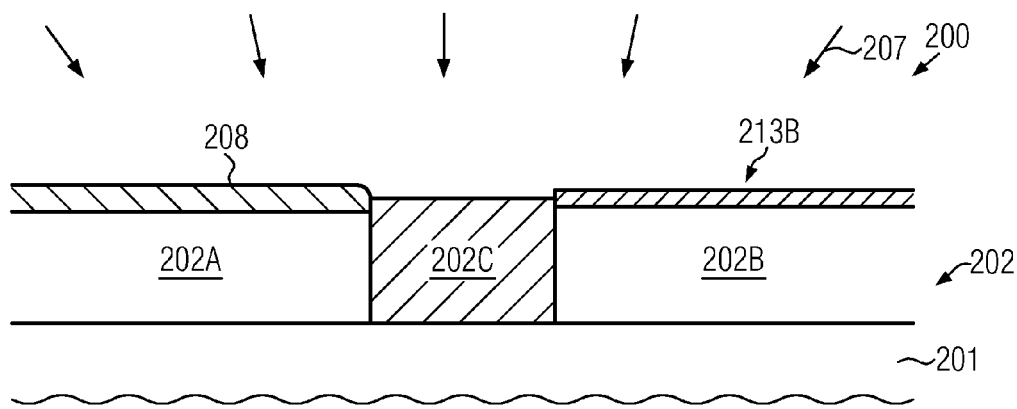

FIG. 2f schematically illustrates the semiconductor device 200 during a selective epitaxial growth process 207, in which a threshold adjusting semiconductor alloy 208, such as a silicon/germanium alloy, may be formed on the active region 202A. Thus, the layer 208 is to be understood as a portion of the active region 202A in order to appropriately adjust the electronic characteristics at and near the surface of the active region 202A. For example, the layer 208 may be provided with a thickness of approximately 12 nm and less with a germanium concentration of up to 25 atomic percent, for example. To this end, well-established deposition recipes may be applied since the oxide-based hard mask material 213B may provide similar process conditions as are also used in conventional strategies.

It should be appreciated that, in other cases, a corresponding adaptation of the process parameters may have to be implemented when the hard mask material formed above the active region 202B may be comprised of a different material, such as silicon nitride, when still preserved above the active region 202B.

Figure 2G:
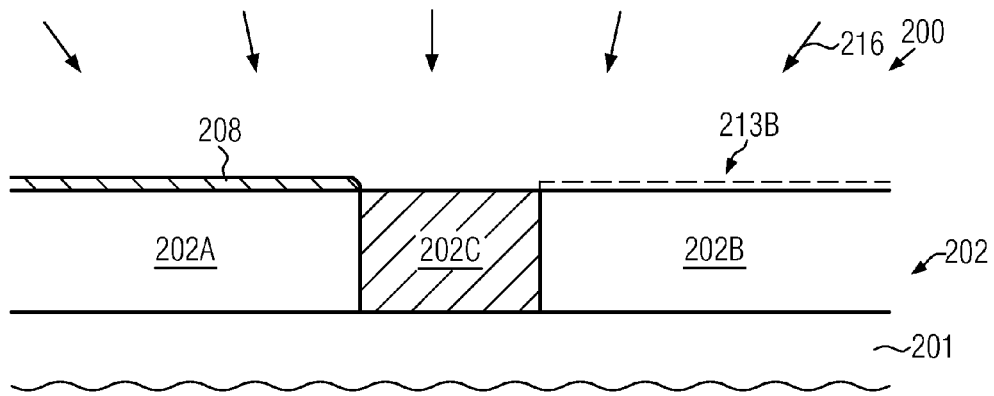

FIG. 2g schematically illustrates the semiconductor device 200 during a removal process 216, which may be performed on the basis of a selective etch chemistry for removing the hard mask material 213B. To this end, in some illustrative embodiments in which the material layer 213B is substantially comprised of silicon dioxide, well-established oxide etch chemistries, such as HF, may be applied. During the etch process 216, therefore, also material of the isolation region 202C may be consumed, wherein, however, the etch time of the process 216 may be significantly reduced compared to conventional strategies, since the layer 213B has a very reduced and highly uniform thickness compared to conventional processes. Thus, a significantly less pronounced difference in surface topography between the active region 202A and the isolation region 202C (not shown) on the one side and between the active region 202B and the isolation region 202C on the other side may be achieved. It should be appreciated that the same holds true for any transition regions in the isolation structure 202C and the active regions 202A, 202B in the transistor width direction, which is to be understood as a direction perpendicular to the drawing plane of FIG. 2g.

Figure 2H:
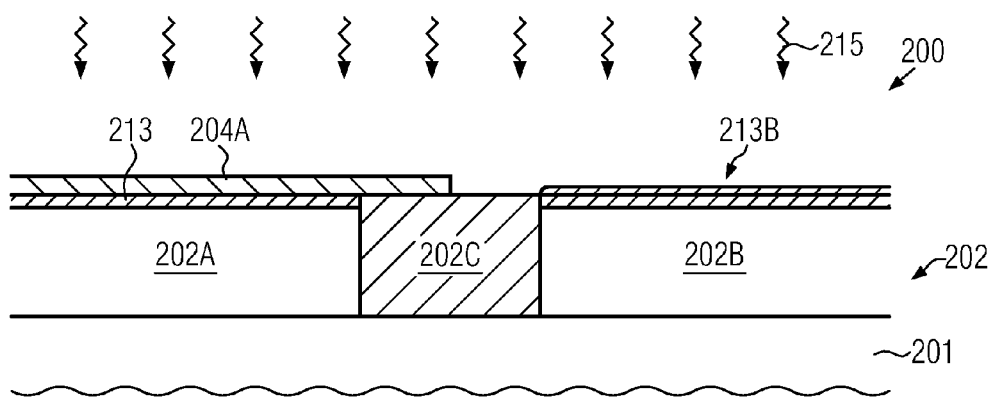
FIGS. 2h-2i schematically illustrate cross-sectional views of the semiconductor device according to further illustrative embodiments in which the oxidation mask may be removed on the basis of a wet chemical etch process prior to actually depositing the threshold adjusting semiconductor alloy.

FIG. 2h schematically illustrates the semiconductor device 200 according to further illustrative embodiments. As shown, the device 200 may be exposed to the oxidation process 215 in order to form the hard mask layer 213B with an appropriate thickness, as is also discussed above. On the other hand, the layer 204A, such as a silicon nitride layer, prevents a further oxidation of the semiconductor material in the active region 202A.

Figure 2I:
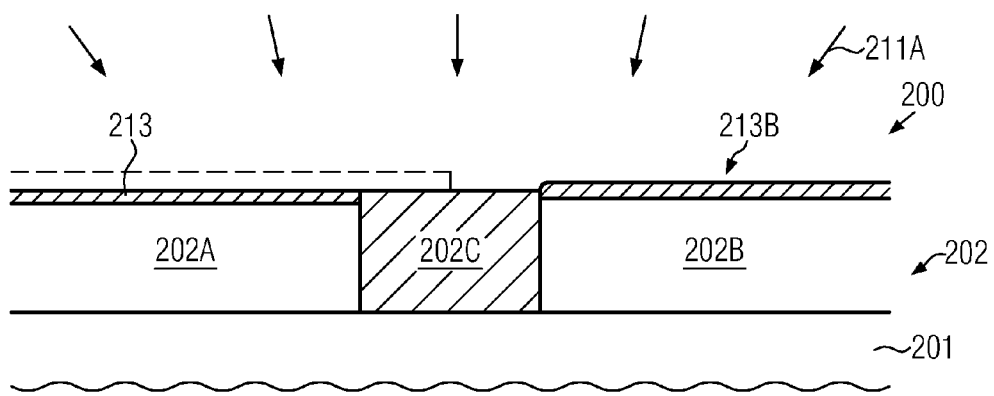

FIG. 2i schematically illustrates the device 200 during a removal process 211A performed on the basis of wet chemical etch recipes. In some illustrative embodiments, the process 211A may be performed on the basis of APM/SPM in order to remove silicon nitride material selectively with respect to silicon dioxide, thereby avoiding undue material erosion in the isolation region 202C and in the hard mask 213B. In this manner, any undue lattice damage in the active region 202A may be avoided, in particular when the pad oxide layer 213 may still be in place in the active region 202A. In other cases, the process 211A based on the above-specified chemistries may also provide a highly selective etch behavior with respect to the silicon material, thereby also avoiding undue material erosion in the active region 202A. Also in this case, a superior crystalline quality is preserved in the active region 202A. It should be appreciated that the pad oxide layer 213 formed on the active region 202A in some illustrative embodiments may be removed during the subsequent cleaning process, such as the process 206 of FIG. 2e, wherein also a certain portion of the material 213B may be consumed, wherein, however, a certain uniform mask layer is still preserved, as is also discussed above. Thereafter, the further processing may be continued by forming the threshold adjusting semiconductor material 208 (FIG. 2f).

Figure 2J:
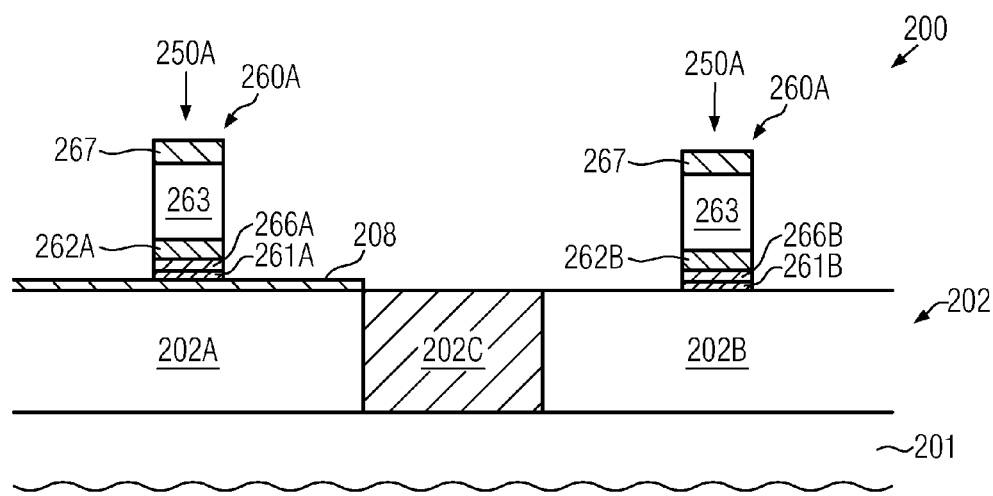
FIG. 2j schematically illustrates the semiconductor device in a further advanced manufacturing stage, i.e., after the patterning of a complex high-k metal gate electrode structure for a P-channel transistor and an N-channel transistor, according to illustrative embodiments.

FIG. 2j schematically illustrates a cross-sectional view of the semiconductor device 200 in a further advanced manufacturing stage. As illustrated, a first gate electrode structure 260A is formed on the active region 202A, i.e., on the threshold adjusting semiconductor material 208. The gate electrode structure 260A may comprise one or more dielectric materials, such as a dielectric material 261A, 266A, at least one of which may comprise a high-k dielectric material. For example, the layer 261A may be provided as a very thin silicon oxide-based material, followed by a high-k dielectric material layer, such as a hafnium oxide material and the like. Moreover, a conductive cap layer 262A may be formed above the gate dielectric materials, followed by a further electrode material, such as amorphous or polycrystalline silicon 263. Finally, a dielectric cap layer or layer system 267 may be provided.

Similarly, a second gate electrode structure 260B may be formed on the active region 202B and may comprise gate dielectric materials 261B, 266B followed by a conductive cap material 262B. Moreover, the further electrode material 263 and the cap layer or layer system 267 may be formed above the sensitive materials 261B, 266B, 262B.

It should be appreciated that the gate electrode structures 260A, 260B, which may represent gate electrode structures of a P-channel transistor and an N-channel transistor, respectively, may be formed on the basis of a target critical dimension for the gate length of 50 nm and significantly less, for instance 30 nm and less. It should be appreciated that the length of the gate electrode structures 260A, 260B is to be understood as the extension of the electrode material 262A in the horizontal direction of FIG. 2j.

The fabrication of the gate electrode structures 260A, 260B may involve the following processes. First, appropriate material or material systems for the one or more gate dielectric materials, such as the materials 261A, 261B, 266A, 266B, may be provided. Typically, a conventional dielectric material may be formed, for instance by oxidation and/or deposition, with a thickness of one nanometer and less in sophisticated applications, followed by the deposition of a high-k dielectric material. Thereafter, appropriate conductive materials, such as titanium nitride, possibly in combination with lanthanum, aluminum and the like, have to be deposited and appropriately patterned so as to provide different material systems above the active regions 202A, 202B. In this manner, appropriate work function values may be adjusted for the gate electrode structure 260A, 260B. During the corresponding patterning process, possibly in combination with additional heat treatments, the superior surface topography of the active regions 202A and 202B, and in particular of the isolation region 202C provided therebetween, in particular in densely packed device areas, as discussed above, may ensure superior process uniformity and thus superior uniformity of the resulting work function and electronic behavior, for instance in terms of leakage currents and the like. Thereafter, the further electrode material 263 in combination with the cap layer system 267 may be deposited and subsequently a further complex patterning sequence may be applied on the basis of sophisticated lithography techniques in order to pattern the resulting gate layer stack. Also in this patterning sequence, the significantly reduced degree of surface topography may result in superior patterning results. It should be appreciated that during this complex patterning sequence it has also to be etched through the materials 261A, 266A, 262A on the one side, and the materials 261B, 266B, 262B on the other side, which may have a different configuration due to the previously performed process sequence for incorporating appropriate work function metal species and the like.

Figure 2K:
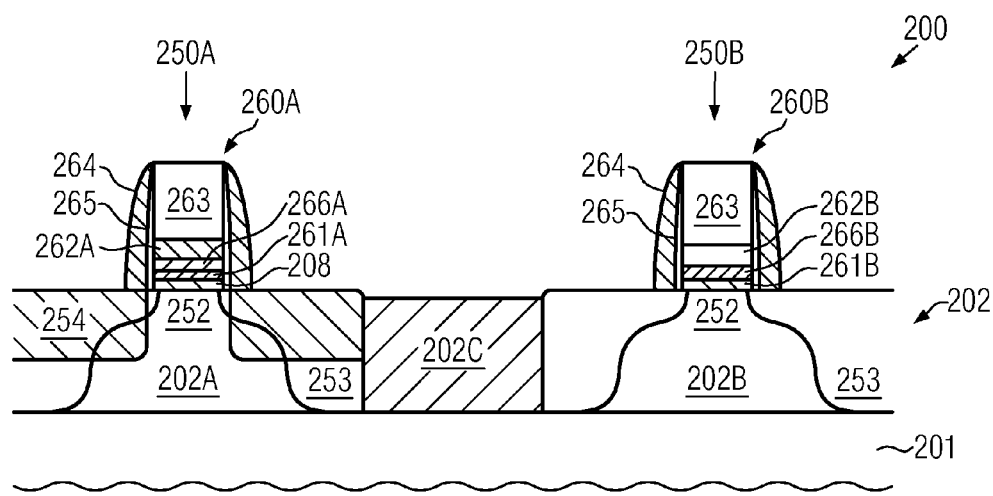
FIG. 2k schematically illustrates the semiconductor device in a further advanced manufacturing stage according to illustrative embodiments.

FIG. 2k schematically illustrates the semiconductor device 200 in a still further advanced manufacturing stage. As shown, a transistor 250A, such as a P-channel transistor, comprises the gate electrode structure 260A which may additionally comprise a protective liner material 265 in combination with a spacer structure 264. Similarly, a second transistor 250B, such as an N-channel transistor, may be formed in and above the active region 202B and comprises the gate electrode structure 260B, which also includes the liner material 265 and the spacer structure 264. Moreover, the transistors 250A, 250B may comprise drain and source regions 253 with any appropriate dopant profile, thereby also laterally enclosing corresponding channel regions 252.

Generally, the transistors 250A, 250B may be formed on the basis of well-established process techniques, wherein the superior uniformity and the results upon patterning the gate electrode structures 260A, 260B may directly translate into superior performance and uniformity of the transistors 250A, 250B. For example, the liner material 265 may be formed with superior uniformity due to the reduced surface topography, thereby also contributing to superior integrity of the sensitive materials 261A, 266A, 262A in the gate electrode structure 260A, and materials 261B, 266B, 262B in the gate electrode structure 260B. Thereafter, the drain and source regions 253 may be formed on the basis of the spacer structure 264, wherein well-established implantation techniques, possibly in combination with other process strategies, may be applied. After any anneal processes, the final lateral and vertical dopant of the drain and source regions 253 may be established. Consequently, in particular in densely packed device areas, such as memory arrays including transistors having a gate length of 30 nm and less, the superior surface topography obtained during the provision of the threshold adjusting semiconductor material 208 may directly translate into reduced variability of transistor characteristics, such as gate leakage, threshold voltage and the like. Moreover, as shown in FIG. 2k, in one or both transistors 250A, 250B, a further performance enhancing mechanism may be implemented, for instance in the form of an embedded strain-inducing semiconductor material 254, such as a silicon/germanium material, which may be formed in some approaches after patterning the gate electrode structures 260A, 260B. Also in this case, additional cleaning processes may be required which may contribute to material erosion in the isolation region 202C, wherein the superior uniformity thereof may thus also result in less variability of the resulting characteristics of the material 254. In this manner, the strain conditions, which may strongly influence the overall performance of the transistor 250A, may be less variable and thus also contribute to superior uniformity of the resulting transistor performance.

As a result, the present disclosure provides manufacturing techniques for forming a threshold adjusting semiconductor alloy with superior uniformity in that the exposure to oxide-consuming reactive etch atmospheres is significantly reduced compared to conventional strategies. To this end, in some illustrative embodiments, a hard mask regime may be applied in which a deposited hard mask material may be efficiently used as an oxidation mask in order to selectively form an oxide mask with reduced thickness and superior uniformity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first hard mask layer above a first active region and a second active region of a semiconductor device;
removing said first hard mask layer selectively from above said second active region;
forming a second hard mask layer selectively above said second active region by performing an oxidation process in the presence of said first hard mask layer that is formed selectively above said first active region;
removing said first hard mask layer selectively from above said first active region;
forming a layer of a semiconductor alloy on said first active region and using said second hard mask layer formed above said second active region as a growth mask;
removing said second hard mask layer; and
forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

2. The method of claim 1, wherein forming said first hard mask layer comprises depositing a hard mask material.

3. The method of claim 2, wherein said hard mask material is deposited so as to comprise a silicon and nitrogen compound.

4. The method of claim 1, wherein removing said first hard mask layer selectively from above said second active region comprises forming an etch mask above said first active region and performing a wet chemical etch process.

5. The method of claim 1, wherein removing said first hard mask layer selectively from above said second active region comprises forming an etch mask above said first active region and performing a plasma-based etch process.

6. The method of claim 1, further comprising forming an oxide layer on said first and second active regions prior to forming said first hard mask layer.

7. The method of claim 1, wherein performing said oxidation process comprises increasing a thickness of an oxide layer formed on said second active region.

8. The method of claim 7, wherein performing said oxidation process further comprises adjusting a thickness of said second hard mask layer to be 6 nm or less.

9. The method of claim 1, wherein said first hard mask layer is formed as a silicon nitride material having a thickness of approximately 10 nm or less.

10. A method of forming a semiconductor device, the method comprising:
- forming a first hard mask layer above a first active region and a second active region;
- removing said first hard mask layer selectively from above said second active region;
- performing an oxidation process in the presence of said first hard mask layer formed above said first active region so as to form a second hard mask layer selectively above said second active region;
- removing said first hard mask layer from above said first active region in the presence of said second hard mask layer;
- forming a layer of a semiconductor alloy in said first active region by using said second hard mask layer as a growth mask; and
- forming a first gate electrode structure of a first transistor on said first active region including said layer of a semiconductor alloy and a second gate electrode structure of a second transistor on said second active region.

11. The method of claim 10, wherein said hard mask layer is formed by depositing a silicon and nitrogen-containing material.

12. The method of claim 10, further comprising forming an oxide liner on said first and second active regions prior to forming said first hard mask layer.

13. The method of claim 12, wherein forming said second hard mask layer comprises increasing a thickness of said oxide liner selectively in said second active region.

14. The method of claim 10, wherein said second hard mask layer is formed with a thickness of 6 nm or less.

15. The method of claim 10, wherein forming said first and second gate electrode structures comprises forming a high-k dielectric material above said layer of a semiconductor alloy and said second active region and forming a first work function metal above said high-k dielectric material in said first active region and forming a second work function species above said high-k dielectric material in said second active region.

16. The method of claim 10, further comprising forming a strain-inducing semiconductor material in said first active region.

17. The method of claim 10, wherein removing said first hard mask layer selectively from said first active region comprises performing a wet chemical etch process.

18. A method, comprising:
- forming an oxide layer on a first active region and a second active region of a semiconductor device;
- depositing a silicon and nitrogen-containing first hard mask layer on said oxide layer that is positioned on said first and second active regions;
- forming an etch mask above said second active region so as to cover a portion of said first hard mask layer above said second active region;
- removing said first hard mask layer selectively from above said first active region;
- removing said oxide layer from above said first active region using said first hard mask layer above said second active region as an etch mask when removing said oxide layer;
- after removing said oxide layer from above said first active region, forming a layer of a semiconductor alloy on said first active region and using said first hard mask layer above said second active region as a growth mask;
- performing an etch process so as to remove said first hard mask layer from above said second active region; and
- forming a first gate electrode structure above said first active region and a second gate electrode structure above said second active region.

19. The method of claim 18, wherein said first hard mask layer is removed from above said first active region by performing a wet chemical etch process.

20. A method, comprising:
- forming a first hard mask layer above a first active region and a second active region of a semiconductor device;
- removing said first hard mask layer selectively from above said second active region;
- forming a second hard mask layer selectively above said second active region;
- removing said first hard mask layer selectively from above said first active region in the presence of said second hard mask layer;
- forming a layer of a semiconductor alloy on said first active region and using said second hard mask layer formed above said second active region as a growth mask;
- removing said second hard mask layer; and
- forming a first gate electrode structure of a first transistor on said layer of a semiconductor alloy and a second gate electrode structure of a second transistor on said second active region, said first and second gate electrode structures comprising a metal-containing gate electrode material and a gate insulation layer comprising a high-k dielectric material.

21. The method of claim 20, wherein forming said second hard mask layer comprises performing an oxidation process in the presence of said first hard mask layer that is formed selectively above said first active region.

22. The method of claim 20, further comprising forming an oxide layer on said first and second active regions prior to forming said first hard mask layer.

* * * * *